(12) United States Patent
Chang et al.

(10) Patent No.: US 11,378,415 B2
(45) Date of Patent: Jul. 5, 2022

(54) METHOD AND SYSTEM FOR DETECTING ANOMALIES IN ENERGY CONSUMPTION

(71) Applicant: GB GAS HOLDINGS LIMITED, Windsor (GB)

(72) Inventors: Jane Chang, Windsor (GB); Laura Shemilt, Windsor (GB); Timothy Wong, Windsor (GB); Andrew Woods, Windsor (GB)

(73) Assignee: GB GAS HOLDINGS LIMITED, Windsor (GB)

( * ) Notice: Subject to any disclaimer, the term of this patent is extended or adjusted under 35 U.S.C. 154(b) by 330 days.

(21) Appl. No.: 16/608,964

(22) PCT Filed: Apr. 27, 2018

(86) PCT No.: PCT/GB2018/051140
§ 371 (c)(1),
(2) Date: Oct. 28, 2019

(87) PCT Pub. No.: WO2018/197904
PCT Pub. Date: Nov. 1, 2018

(65) Prior Publication Data
US 2020/0182653 A1    Jun. 11, 2020

(30) Foreign Application Priority Data
Apr. 28, 2017  (GB) .................................... 1706871

(51) Int. Cl.
*G01D 4/00* (2006.01)
*G01R 22/06* (2006.01)
(Continued)

(52) U.S. Cl.
CPC ............. *G01D 4/004* (2013.01); *G01D 4/008* (2013.01); *G01R 22/066* (2013.01); *G01R 22/10* (2013.01); *G06Q 50/06* (2013.01)

(58) Field of Classification Search
USPC ............................. 324/74, 110; 340/870.02
See application file for complete search history.

(56) References Cited

U.S. PATENT DOCUMENTS

| 7,106,044 B1 | 9/2006 | Lee, Jr. et al. |
| 2007/0103335 A1 | 5/2007 | Fitzgerald et al. |

(Continued)

FOREIGN PATENT DOCUMENTS

| CN | 203350356 U | 12/2013 |
| CN | 105914876 A | 8/2016 |

(Continued)

OTHER PUBLICATIONS

Combined Search and Examination Report issued by the GB Intellectual Property Office in Application No. GB1706871.9 dated Sep. 28, 2017. 9 pages.

(Continued)

*Primary Examiner* — Vincent Q Nguyen
(74) *Attorney, Agent, or Firm* — Meunier Carlin & Curfman LLC

(57) ABSTRACT

A method of detecting conditions indicative of energy meter tampering, meter faults or energy loss (e.g. due to energy theft) is disclosed. The method includes receiving energy consumption data from an energy meter indicating consumption of energy at a location served by the energy meter. Event data is also received from the meter comprising one or more events generated by the energy meter. The consumption data is analysed to detect a predetermined consumption condition. The event data is analysed to detect a predetermined event or event pattern in the event data. An alert condition is generated in response to detecting both the consumption condition and the event or event pattern.

19 Claims, 10 Drawing Sheets

(51) Int. Cl.
*G01R 22/10* (2006.01)
*G06Q 50/06* (2012.01)

(56) References Cited

U.S. PATENT DOCUMENTS

| | | | |
|---|---|---|---|
| 2007/0247331 A1* | 10/2007 | Angelis | G01D 4/006 340/870.02 |
| 2012/0101653 A1 | 4/2012 | Tran | |
| 2012/0150462 A1 | 6/2012 | Voisine | |
| 2012/0245869 A1* | 9/2012 | Ansari | H02J 13/00022 702/62 |
| 2012/0326884 A1* | 12/2012 | Cornwall | F17D 3/01 340/870.02 |
| 2013/0271289 A1 | 10/2013 | Hampapur et al. | |
| 2016/0035052 A1 | 2/2016 | Tran | |

FOREIGN PATENT DOCUMENTS

| | | |
|---|---|---|
| EP | 2221589 A1 | 8/2010 |
| EP | 3076138 A1 | 10/2016 |
| GB | 2312963 A | 11/1997 |
| GB | 2507184 A | 4/2014 |
| WO | 2015/124972 A1 | 8/2015 |

OTHER PUBLICATIONS

International Search Report and Written Opinion issued by the International Searching Authority (ISA/EP) in Application No. PCT/GB2018/051140 dated Jul. 27, 2018. 10 pages.
European Search Report dated Aug. 4, 2020 for Application No. 18 722 712.9.

* cited by examiner

METHOD AND SYSTEM FOR DETECTING ANOMALIES IN ENERGY CONSUMPTION

CROSS-REFERENCE TO RELATED APPLICATIONS

This application is a national stage application, filed under 35 U.S.C. § 371, of PCT/GB2018/051140, filed Apr. 27, 2018, which claims the benefit of and priority to United Kingdom Application No. 1706871.9, filed Apr. 28, 2017, the disclosures of which are expressly incorporated herein by reference in their entireties.

The present invention relates to analysing energy consumption and detecting anomalies in consumption. More particularly, the present invention relates to detecting tampering and energy theft using data obtained from smart meters.

Energy theft is a critical issue for the UK and worldwide; estimated electricity theft worldwide ranges from 20% to 50% of the total consumption. According to the International Utilities Revenue Protection Association based in the US, the level of revenue lost worldwide in energy theft may be as high as US$6bn. Yet it has been technically difficult and/or cost prohibitive to many companies to detect energy theft. The probability of theft is less than 0.1% as estimated from historic success rate but the value at stake is high.

Energy theft commonly involves some form of tampering with an energy meter, so that the energy meter records less than the full amount of energy actually being consumed by the household or business associated with the meter. Traditionally, when a meter is suspected to have been tampered with, verification is done by physical examination of the meter on site. The success rate of this approach is low and the process is labour-intensive. In addition, when theft is identified, there is no accurate way to pinpoint when the tampering and energy theft occurred.

Some meters, such as "smart meters", have facilities for monitoring any tampering events but the operation of monitoring and analysing meter logs with a big portfolio of meters is highly complex.

There are a number of reasons for this. Firstly, there are many possible error messages that can be triggered on a smart meter, and when deployed at scale in different geographical environments, there are many combinations of situations where these messages may be triggered; not all of them are security threats. It requires metering experts to interpret the different messages to make sense of the situation.

Secondly, staging the data and interpreting the event and tamper logs, and being able to analyse the data in a systematic way requires considerable resources. It has been prohibitively costly and ineffective to examine the logs without an effective means of handling the high volume of data.

The biggest advantage of a smart meter over a conventional meter is its ability to communicate with the energy supplier remotely without the need for a physical site visit. This key benefit of smart meters is also the biggest security threat. Visits to the meters may be reduced (typically) from once a quarter to once every two years, and physical tampering of smart meters may not be detected for a substantial period.

By 2020, in excess of 50 million smart meters are expected to have been installed in the United Kingdom. Furthermore, smart metering systems are being deployed globally in other countries such the USA and Canada, Italy, The Netherlands, Germany and South Africa. Smart meters will become a part of the UK's critical national infrastructure and the energy industry will benefit from understanding the state of health of the smart meters in operation. One of many possible security controls is to perform active monitoring of the event logs, alerts and messages generated by the meters but such monitoring does not address energy theft. The monitoring will post a large number of incidents that metering experts would have to examine and verify.

The invention seeks to address some of the problems with conventional approaches to energy theft detection.

Aspects of the invention are set out in the independent claim(s) and preferred features are set out in the dependent claims.

In a first aspect of the invention, there is provided a method of detecting conditions indicative of utility meter tampering, meter faults or theft of a utility, comprising: receiving, from a meter: consumption data indicating consumption of a utility at a location served by the meter; and event data comprising one or more events generated by the meter. The method further comprises analysing the consumption data to detect a predetermined consumption condition; analysing the event data to detect a predetermined event or event pattern in the event data; and generating an alert condition in response to detecting both the consumption condition and the event or event pattern.

The alert condition is preferably indicative of a suspicion of tampering, meter fault, or utility loss/theft. Utility loss may typically be as a result of deliberate theft (e.g. by meter tampering) but could also be due to faulty equipment. The alert condition may take the form of setting a status flag in a meter database, generating an alert notification or the like, as set out below. The term "utility" as used herein preferably refers to any consumable supplied by a utility provider to locations (e.g. houses, buildings, apartments, offices etc.) and includes energy as well as consumable substances (e.g. water). The meter may thus be any type of utility meter or supply meter (e.g. electricity, gas, water etc.) and the method may be used to detect any type of utility or supply loss/theft.

The alert condition is preferably generated in response to detecting a temporal correlation between the consumption condition and the event or event pattern. Thus, the consumption condition and event (pattern) preferably have to meet a temporal criterion in order to trigger the alert condition; in a preferred embodiment, the alert condition is generated in response to detecting that the consumption condition occurs in the consumption data within a predetermined temporal distance from the occurrence of the event or event pattern in the event data.

Where reference is made herein to the time of occurrence of an event, event pattern or consumption condition, this is preferably in relation to timing information in the source data, where timing information in the consumption data indicates the time at which the consumption data was measured or reported by the meter and timing information in the event data indicates the time at which events are generated/transmitted by the meter. Thus references to timings (and by extension to timing relationships e.g. between consumption and events) relate to the times at which the consumption occurred/was measured and the times at which events occurred/were generated, not to the time at which the analysis of the data is performed.

In one embodiment, the method comprises (initially) analysing the consumption data to detect the consumption condition; and performing the step of analysing the event data in response to detecting the consumption condition. Thus, the event data is preferably only analysed once the consumption condition has been found, reducing the need to analyse all of the data and thereby improving computational efficiency.

Preferably, the consumption data comprises a time series of consumption values associated with time information, and detecting the consumption condition preferably comprises determining a time at which the consumption condition occurs in the consumption data. Each event in the event data is preferably associated with time information indicating a time of the event, the method comprising selecting a set of event data temporally adjacent to the detected consumption condition, wherein the step of analysing event data comprises analysing the selected set of event data. Preferably, a set of event data is selected in a time window including the time of the consumption condition, the time window preferably having a predetermined duration and/or including one or both of: a time period immediately preceding the time of the consumption condition and a time period immediately subsequent to the time of the consumption condition.

In another embodiment, the method comprises (initially) analysing the event data to detect a predetermined event or event pattern; and performing the step of analysing the consumption data in response to detecting the event or event pattern. Thus, the consumption data is preferably only analysed once a relevant event/event pattern has been found. The consumption data preferably comprises a time series of consumption values associated with time information, and each event in the event data is preferably associated with time information indicating a time of the event. The method preferably comprises selecting a set of consumption data temporally adjacent to the detected event or event pattern, wherein the step of analysing consumption data comprises analysing the selected set of consumption data. The method may comprise selecting a set of consumption data corresponding to a given time window, the time window selected in dependence on a time of the detected event or event pattern, wherein the time window preferably includes the time of the event or event pattern and one or both of: a time period immediately preceding the event (pattern) and a time period immediately subsequent to the event (pattern).

The consumption condition preferably comprises a decrease in consumption. Detecting the consumption condition preferably comprises detecting the decrease in consumption, the decrease preferably having an absolute or relative magnitude exceeding a threshold magnitude. The threshold magnitude may thus be expressed as an absolute consumption value, or as a relative value, e.g. as a proportion (i.e. factor less than one) of the consumption value prior to the decrease.

The consumption condition may comprise a decrease in consumption followed by a sustained period of low consumption. Detecting the consumption condition preferably comprises detecting, subsequent to the decrease in consumption, a period of a predetermined duration during which the consumption remains below a threshold consumption amount (this may again be absolute, or relative in relation to the pre-decrease amount).

Analysing the consumption data preferably comprises comparing consumption data temporally preceding the detected event or event pattern to consumption data temporally succeeding the detected event or event pattern to detect the decrease in consumption. The decrease in consumption is preferably detected in response to the consumption after the event or event pattern being lower than the consumption before the event or event pattern.

The method may comprise computing an indicator indicating whether the decrease is statistically significant, and detecting the consumption condition in dependence on the indicator (e.g. in response to the indicator indicating that the decrease is statistically significance in accordance with some criterion, e.g. a significance threshold).

The consumption condition may alternatively or additionally comprise a divergence in consumption from a predetermined typical consumption value. The method may comprise determining the typical consumption value based on consumption data for a set of meters of which the meter is a member, optionally wherein the set of meters is selected based on geographical proximity of the installation locations of the meters in the set. The set of meters used as basis for the consumption comparison may alternatively be selected based on other criteria; e.g. a set of meters associated with utility customers having one more common customer attributes or associated with properties having one or more common property attributes.

Preferably, detecting the event or event pattern comprises detecting one or more events matching predetermined criteria. For example, this may involve detecting one or more events having predetermined event types (e.g. alert codes).

The event pattern may comprise at least two events. An event pattern may comprise a predetermined sequence of events, the method comprising detecting the event pattern in response to identifying an ordered set of events in the received event data matching the predetermined event sequence.

A pattern or sequence may also have to meet temporal criteria. For example, an event pattern may comprise a first and second event occurring within a specified time duration of each other, the method comprising matching the event pattern in response to identifying a set of events in the event data matching the pattern and occurring within the specified duration.

Detecting a predetermined event pattern may alternatively or additionally comprise detecting an anomalous event pattern that differs from an expected event pattern. The method may include analysing event data from a plurality of meters to determine one or more expected event patterns, preferably using a machine learning process and/or event clustering.

Preferably, the consumption data comprises a time series of consumption values, each consumption value indicating an amount of a utility consumed during a given time interval, each consumption value associated with a time indication specifying a time at which the consumption was measured by the meter.

The method may comprise aggregating the consumption data, preferably to generate aggregate consumption data having a reduced time resolution compared to the consumption data received from the meter. The step of analysing the consumption data to detect a predetermined consumption condition then preferably comprises analysing the aggregate consumption data (e.g. instead of the data in the form in which it is received from the meter) and detecting the consumption condition based on the aggregate consumption data.

Preferably, the meter is an energy meter for measuring energy consumption, and the consumption data comprises energy consumption data. The energy consumption data may comprise energy consumption values indicating energy consumption in terms of physical energy quantities or in terms of quantities of fuel (e.g. gas) consumed.

Events in the event data may include alerts or messages generated by the meter indicating a status or status change of the meter.

The meter may be one of: an electricity meter, a gas meter, and a water meter.

The meter is preferably a network-connected smart meter, preferably wherein the consumption data and/or event data are received via one or more networks, optionally including the Internet. A smart meter may comprise a system including one or more meters and a separate communications/processing device connectable to the meter(s) for receiving consumption and event data from meters, optionally processing the data and/or generating additional data, and transmitting the data via a network. Alternatively, a smart meter may comprise a meter and communications/processing facilities integrated into a single device.

Generating the alert condition may comprise one or more of: setting a meter attribute associated with the meter in a database to indicate a suspected condition indicative of meter tampering, meter fault or supply/utility theft; outputting an alert indication to a user interface; sending an alert notification to a user device associated with an operator or other user; and scheduling a physical examination of the meter.

The method may comprise receiving consumption data and event data from a plurality of meters, and performing the steps of analysing consumption data and event data for one or more selected ones (or all) of the plurality of meters. The method may comprise analysing consumption data for a plurality of meters to identify a subset of meters for which a predetermined consumption condition is detected and subsequently analysing event data for the subset of meters to detect a predetermined or anomalous event or event pattern. Alternatively, the method may comprise analysing event data for a plurality of meters to identify a subset of meters for which a predetermined or anomalous event or event pattern is detected, and subsequently analysing consumption data for the subset of meters to detect a predetermined consumption condition.

Preferably, the method includes segmenting the received data for the plurality of meters into subsets in dependence on one or more parameters, and performing one or both of the analysis of consumption data and the analysis of event data for a selected one of the subsets. The one or more predetermined parameters may include any one of, or any combination of: geographical area of a location where a meter is installed (e.g. postal code), demographic groups of a utility customer associated with a meter, meter type, utility type, and customer type (e.g. home or industrial).

In a further aspect of the invention, there is provided a method of analysing data from a plurality of utility meters to determine whether a physical examination of a utility meter is required, the method comprising: receiving meter readings and meter events from the plurality of utility meters; compiling a data set from the meter readings and meter events; segmenting the data set into subsets according to one or more predetermined parameters; analysing data in a subset using statistical and/or pattern matching methods to determine whether meter readings or meter events from each meter are abnormal; identifying a meter that generated abnormal data; and sending a notification to an operator including an indication of the meter identified as abnormal.

The one or more predetermined parameters may include any one of, or any combination of: geographical area of a location where a meter is installed (e.g. postal code), demographic group of a utility customer associated with a meter, meter type, utility type, and customer type (e.g. home or industrial). The method may further comprise separating the meter reading data from the meter event data.

Preferably, the meter event data for a plurality of meters is analysed to identify a subset of meters associated with abnormal events or event patterns, and then meter readings for the meters in the identified subset are analysed to identify abnormal consumption patterns. Alternatively, the meter reading data for a plurality of meters may be analysed to identify a subset of meters associated with abnormal consumption, and then the meter event data for meters in the identified subset is analysed to identify abnormal events or event patterns.

The method according to this aspect of the invention may further include performing any method as set out above in connection with the first aspect of the invention.

While many examples set out herein concern metering of energy consumption, the invention may also be applied to consumption of other supplied consumables, such as water, in which case the meter could be a water meter. References to energy metering and consumption herein should be construed to include metering and consumption of any other such consumable quantities or metered utilities.

In a further aspect of the invention, there is provided a method of detecting conditions indicative of energy meter tampering, meter faults or energy loss, comprising: receiving, from an energy meter: energy consumption data indicating consumption of energy at a location served by the energy meter; and event data comprising one or more events generated by the energy meter. The method further comprises analysing the energy consumption data to detect a predetermined consumption condition; analysing the event data to detect a predetermined event or event pattern in the event data; and generating an alert condition in response to detecting both the consumption condition and the event or event pattern. The method may include the further steps or features of a method according to any of the above aspects of the invention.

The invention also provides a computer-readable medium comprising software code adapted, when executed on a data processing apparatus, to perform any method as set out herein. The invention also provides a system having means, optionally in the form of a processor and associated memory, for performing any method as set out herein.

Any feature in one aspect of the invention may be applied to other aspects of the invention, in any appropriate combination. In particular, method aspects may be applied to system/computer program aspects, and vice versa.

It should also be appreciated that particular combinations of the various features described and defined in any aspects of the invention can be implemented and/or supplied and/or used independently.

BRIEF DESCRIPTION OF THE FIGURES

Embodiments will now be described, by way of example only and with reference to the accompanying drawings, in which.

DETAILED DESCRIPTION OF THE INVENTION

Figure 1A:
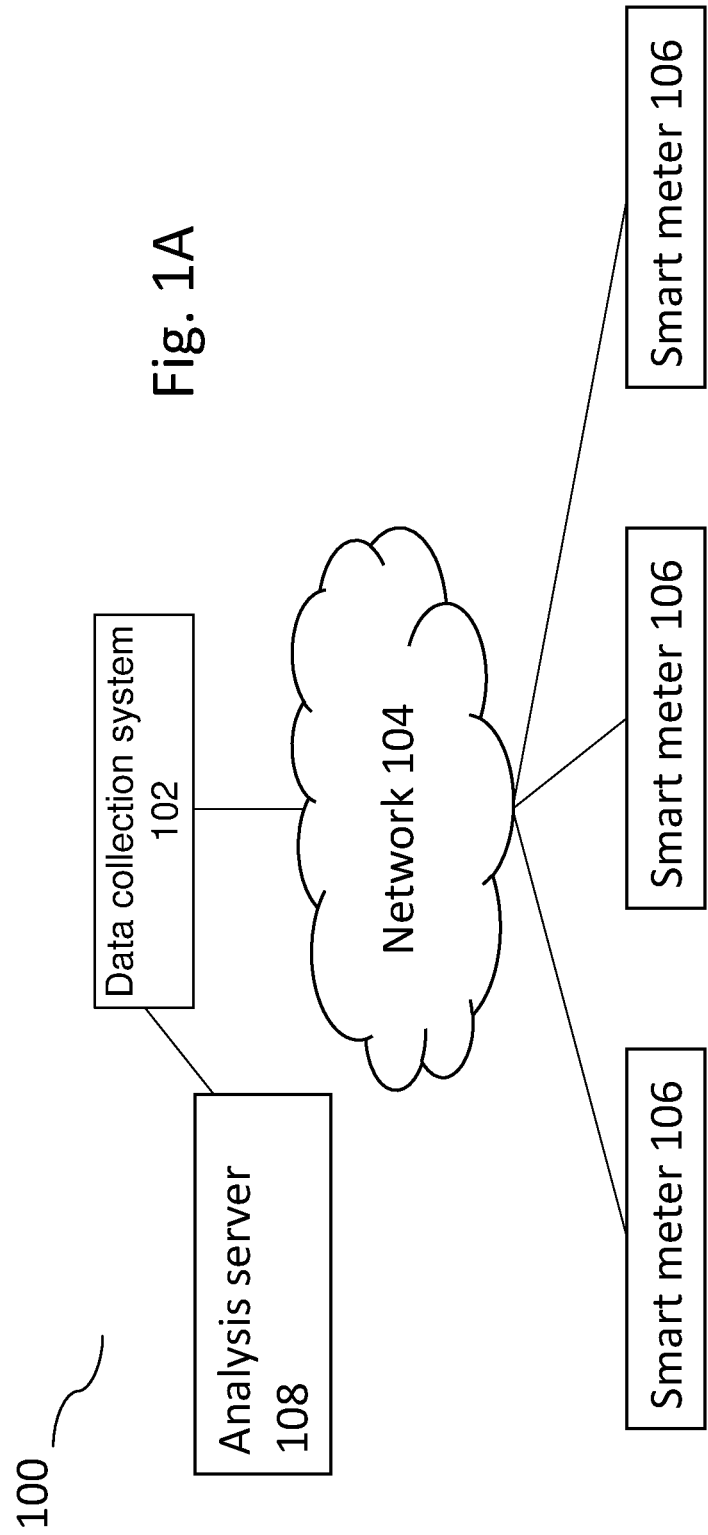
FIGS. 1A and 1B illustrate exemplary systems for detecting tampering and energy theft using data obtained from smart meters.

Embodiments of the invention provide a system for detecting tampering and energy theft using data obtained from smart meters. An example of such a system is shown in overview in FIG. 1A.

The system 100 includes a data collection system 102 for collecting data relating to energy consumption and meter operation. The data collection system 102 is connected via a network 104 to a plurality of smart meters 106. Network 104 may in practice include local area networks (including wired/wireless networks), wide-area networks (including public networks e.g. the Internet) and any combination.

An analysis server 108 is provided for performing data analysis and detecting tampering and energy theft events. The analysis server 108 may connect to the data collection system 102 via a private/local network (e.g. directly, as shown), and/or via the Internet (e.g. via network 104).

Smart meters are installed at locations where energy is supplied. These may be residential properties (e.g. houses/apartments), commercial properties (e.g. offices, factories) or any other appropriate location. The smart meters measure consumption of energy at the location (e.g. by appliances connected to an energy supply monitored by a smart meter). Energy may be supplied in any appropriate form, e.g. as a combustible fuel (e.g. natural gas), or electricity. Thus, in typical examples, the smart meter is a gas meter or electricity meter. In other cases a smart meter may be a water meter or a meter for another sort of utility.

The smart meters record two types of information: (1) energy consumption data and (2) meter events such as alerts and status messages (e.g. indicating a current status or change in status of the smart meter). The consumption data and events are sent by the smart meters to the data collection system periodically or on demand. In a typical example, consumption data is transmitted at predetermined intervals (e.g. half-hourly), whilst events are transmitted when they occur (i.e. when they are detected/generated by the meter). Alternatively events may be transmitted periodically as well (e.g. together with the consumption data, or separately, at the same or a different reporting frequency).

The data collection system 102 receives the consumption data and events from the smart meters and stores the data in a database. The data received/stored may be raw data (as collected) or may be processed in some way before storing (e.g. to cleanse, aggregate and/or convert data or perform other required pre-processing or calculations). For example, raw meter readings may be converted to consumption data in the required format, time resolution, unit of measurement etc. The (raw or processed) data is then used by the analysis server 108 to perform analysis and detect (suspected) tampering, energy theft, faults etc.

Each unit of consumption data received from a meter (e.g. at half-hourly intervals) includes a consumption value indicating a total energy consumption in the preceding monitored time period (e.g. in the preceding half-hour). Alternatively, a unit of data received from the meter could include a time series of multiple values indicating usage at a finer temporal resolution (e.g. every minute). In any case, each energy consumption value received relates to a particular time interval and is associated with a time indication indicating the time the energy consumption was recorded (e.g. as a date and time stamp). Consumption may be recorded in any suitable units of measurement, such as energy (e.g. in Joules or kWh) or quantity (volume or mass) of fuel or other physical substance consumed (e.g. in cubic metres).

The data collection system 102 and/or analysis server 108 may aggregate the raw consumption data from smart meters. Aggregation may include summing consumption over particular time intervals, computing average consumptions over particular intervals, or applying any other statistical processing. Other types of processing may be performed instead of or in addition to aggregation (as mentioned above). In one embodiment, the consumption data is aggregated (e.g. by summation) to produce consumption data at a different time resolution (e.g. daily) more suited to the analysis. In that case, the pre-processed/aggregated data (itself associated with time information as described above, indicating the times/time periods to which aggregated consumption values relate) is used as input to the subsequent analysis.

Event data is sent from each meter 106 to the data collection system 102 as a stream of "alerts", control messages provided by the meter to indicate its status. Each alert is considered herein to be an "event" in the event data and could, for example, indicate normal system behaviour such as switching the meter from on to off, or warnings that the meter is in a critical state.

Event data is similarly associated with time information. In particular, each event received from a smart meter contains descriptive information (e.g. an event type, which may be specified by way of an event code) and a date and/or time stamp, optionally along with other relevant information (which may be specific to the event type).

Tampering may, for example, involve bypassing a smart meter, physically modifying a meter or its connections, or attempts to reconfigure the meter or modify its software, usually with the aim of preventing the meter from registering consumption or causing the meter to register reduced consumption. Thus, events that might be relevant to detecting tampering could include meter alerts indicative of:

a meter housing being opened attempts to establish a data connection to the smart meter (this could be by a wired or wireless connection), regardless of whether successful or not software modifications Some events may be particularly relevant in detecting tampering and energy theft and these are referred to herein as critical events or critical alerts.

Table 1 below gives examples of particular events (with event codes and descriptions) that have been found in the output of smart meters where tampering has occurred. The specific event codes and details will of course vary between make and model of smart meters.

TABLE 1

| Event Code | Message |
| --- | --- |
| 300D | EFA V-Voltage Tolerance Condition became Active from Unlatched |
| 30CA | EFA T-Tamper Condition became Inactive and Latched |
| 308A | EFA T-Tamper Condition became Active from Latched |
| 300A | EFA T-Tamper Condition became Active from Unlatched |
| 3008 | EFA M-Reverse Power Condition became Active from Unlatched |
| 300E | EFA S-Asymmetric Power Condition became Active from Unlatched |

TABLE 1-continued

| Event Code | Message |
| --- | --- |
| 308E | EFA S-Asymmetric Power Condition became Active from Latched |
| 30CE | EFA S-Asymmetric Power Condition became Inactive and Latched |

FIG. 1A presents a simplified view of a metering and analysis system. In practice, a smart meter as shown in FIG. 1A and as discussed throughout this description may in fact comprise multiple components forming a smart meter system.

Figure 1B:
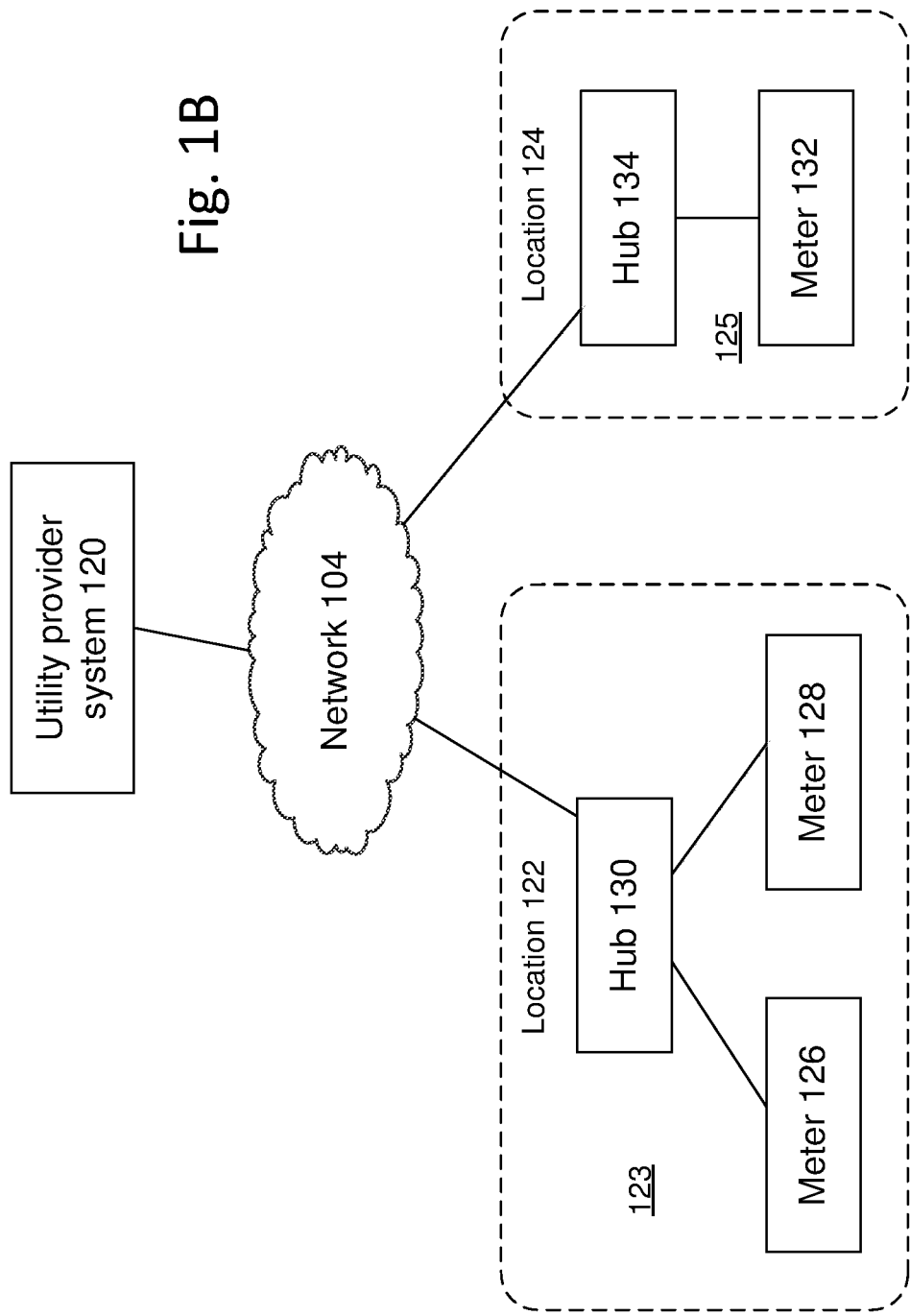

This is illustrated in the arrangement shown in FIG. 1B.

Typically, a smart meter is configured as a system comprising one or more consumption units (or meters) each arranged to measure an amount of a utility being consumed over a given timeframe (such as gas, electricity, water or the like) linked to a communication network for reporting the outputs from the consumption units over a network. In this example, a smart meter system 123 is installed at location 122 comprising meters 126 and 128, whilst another smart meter system 125 is installed at another location 124 and comprises a single metering device 132. Locations may correspond e.g. to particular properties where meter systems are installed, e.g. houses, apartments, offices or other buildings or parts of buildings. However, a single smart meter system may also span multiple physical locations.

A hub or other consumer access device can be provided to provide network communication facilities for the meter(s) and to consolidate the readings from each of the consumption units before the readings are transmitted over the network to a utility company or billing agent (e.g. hub 130 in smart meter system 123 and hub 134 in smart meter system 125, transmitting data via network 104 to the utility provider systems 120—the latter may include the data collection system 102 and/or analysis server 108 of FIG. 1A).

A processor can also be included in the smart meter system (e.g. in the hub, meter, or separately) for cleansing and otherwise pre-processing the consumption measurement data before it is transmitted over network 104. The processor unit can also be configured to perform data analysis on the meter readings before transmission takes place. For example, the processor can perform some or all of the analysis performed by the analysis server 108 of FIG. 1A. More generally, any of the data analysis described herein may be performed at the smart meter system, a central system such as analysis server 108, or any other components, and analysis may be distributed between any of these components in any suitable fashion.

Where at least some analysis is performed by a processor in the smart meter system (e.g. by hub 130/134), notifications indicating suspicious occurrences can be transmitted directly from the smart meter system. It is also envisaged that the processor could form a part of a pervasive computing system within the home or commercial unit where the smart meter system is located.

The following describes the analysis as performed in the FIG. 1A embodiment, i.e. with analysis performed at the analysis server 108. However, it will be understood that the analysis can be performed partly or wholly elsewhere, e.g. in a processor in the hub of the smart meter system, as mentioned above.

Tampering/Energy Theft Detection

The analysis server 108 analyses the received consumption and event data to identify patterns that may be indicative of tampering and/or energy theft. Broadly speaking, the analysis performed is based on correlating patterns in the consumption data with specific events, or patterns of events, in the event stream. A number of different approaches to the analysis are summarised in FIGS. 2A-2E.

Figure 2B:
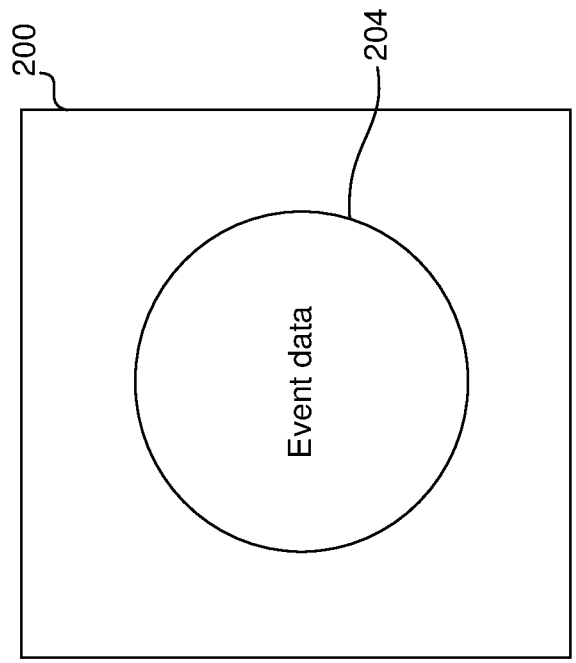
FIGS. 2A-2E show a number of approaches to analysing smart meter data.
Figure 2A:
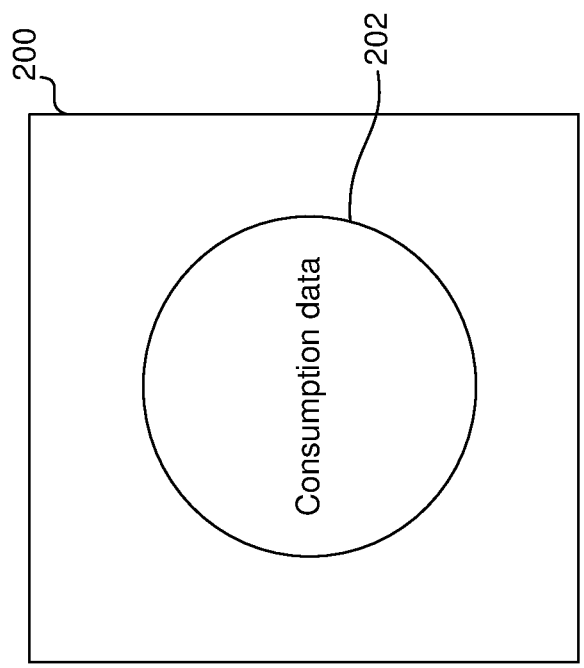

FIG. 2A shows an analysis where the consumption data is analysed for patterns that may indicate suspicious activity. Here, box 200 represents all data collected from all the smart meter systems. The subset 202 of consumption data represents data from a given subset of smart meters that is to be analysed (or a subset that has been analysed and flagged for further analysis). This subset can be comprised of meter readings from a given segment of meters, for example selected by postal code or other geographical area, customer demographic of the utility customer associated with the meter, consumption levels, meter type, property type etc. This subset is then analysed for anomalies.

FIG. 2B shows an analysis approach where the event data is analysed for events or event patterns that may indicate suspicious activity. Here, box 200 represents all data collected from all the smart meter systems, with the subset 204 of data comprising the event data selected for analysis (or a subset that has been analysed and flagged for further analysis). The subset may comprise event data for a given set of smart meter systems/meters, where the set is again selected based on one or more parameters (e.g. postcode, demographic, etc.) as described above. Alternatively or additionally, specific subsets of events or event types may be selected for inclusion in subset 204. The selected subset is then analysed for anomalies.

Figure 2C:
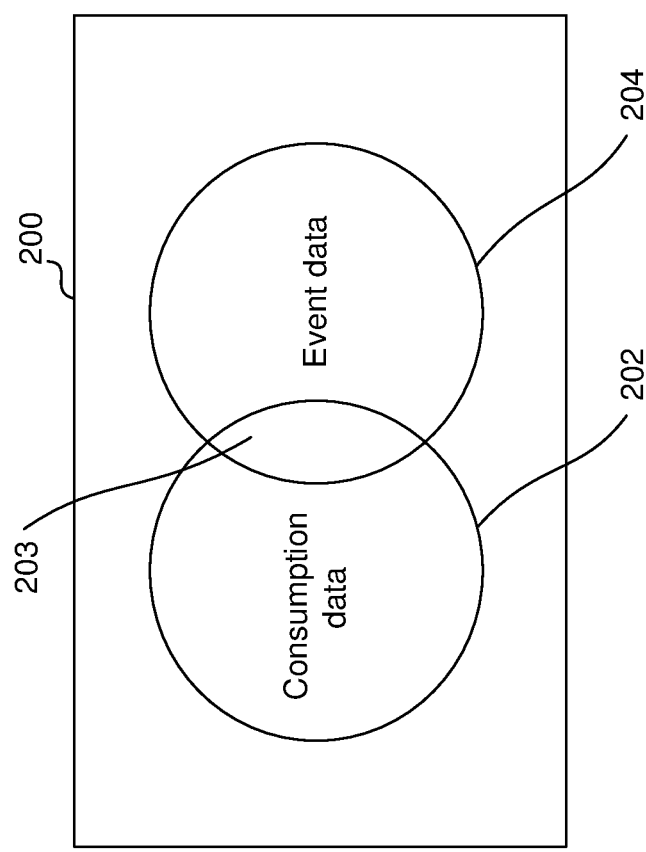

FIG. 2C shows an analysis approach where the selected consumption data 202 (selected from all gathered data 200) is analysed for patterns that may indicate suspicious activity (as per FIG. 2A). At the same time (e.g. independently and in parallel) suspicious events or event patterns are identified in the event data 204 (as per FIG. 2B). The analysis then identifies particular meters that show both a suspicious consumption pattern and a suspicious event pattern to identify cases of suspected energy theft (intersection 203). Thus, in this approach, the set of suspected energy theft cases is given by independently determining the subset of smart meters (from the analysed meters) showing a relevant energy consumption pattern (e.g. consumption drop), and the subset of smart meters (from the analysed meters) showing a suspicious event pattern, and determining the intersection between those subsets.

Temporal correlation between identified consumption patterns and event patterns may be taken into account—for example; a correlation process may identify instances where a suspicious consumption pattern occurs close in time to a suspicious event or event pattern.

Figure 2E:
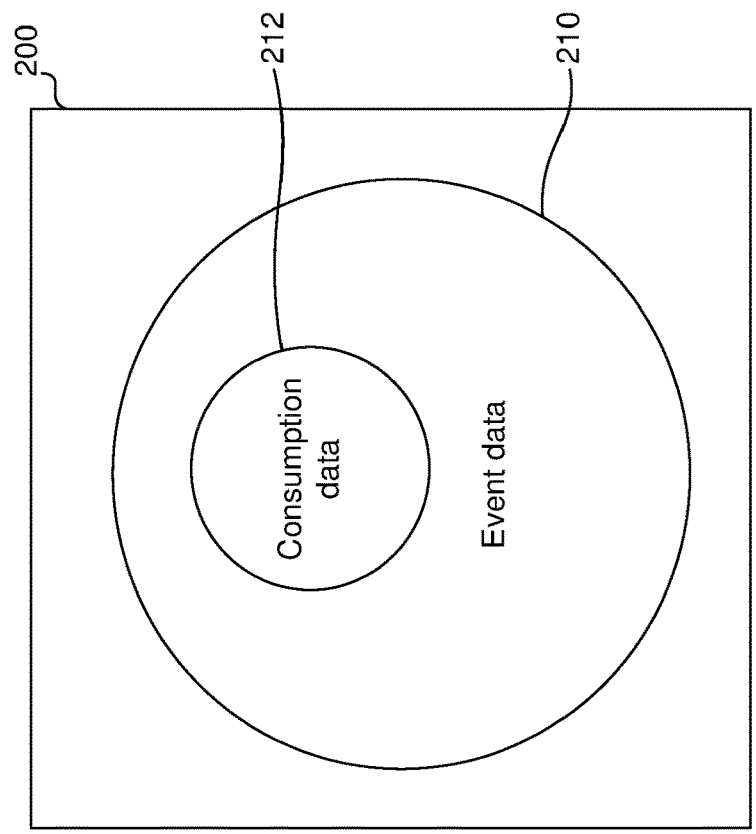
Figure 2D:
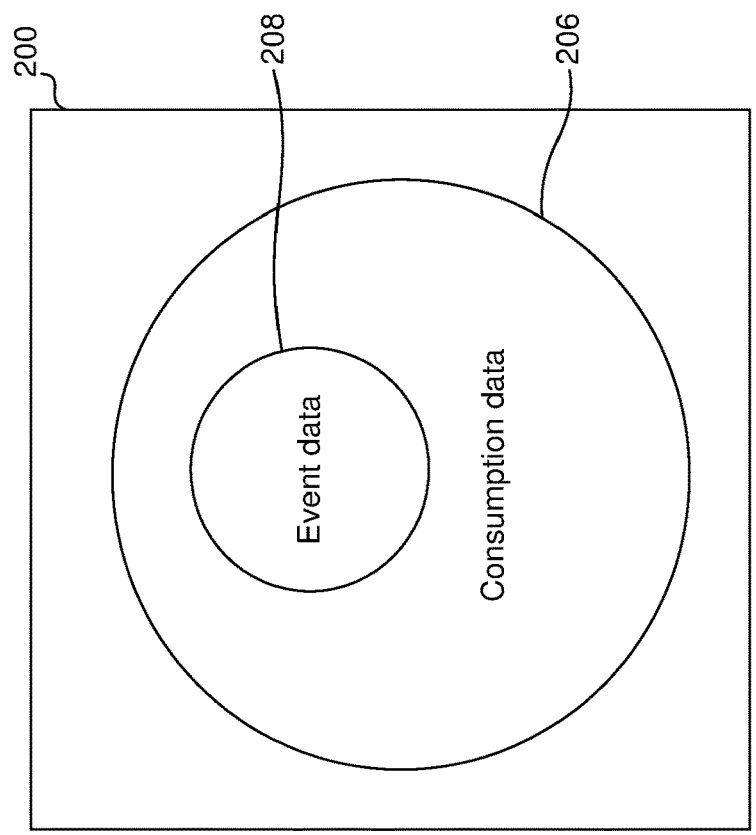

FIG. 2D illustrates a further approach, in which consumption data is initially analysed for suspicious consumption patterns (e.g. potentially suspicious drops in consumption). Again, the consumption data 206 may be a particular selected subset of consumption data, e.g. for a particular set of smart meters (selected as described above and/or flagged for further analysis during earlier analysis), taken from the totality of collected data 200. Any identified suspicious consumption patterns are then processed further by analysing the corresponding event data 208 for the suspicious smart meters (e.g. for a time period that includes the suspicious consumption pattern) to look for events or event patterns associated with tampering. If a relevant event/event pattern is found, then the meter is flagged as suspicious. Thus, in this approach, the set of suspected energy theft cases is given by first determining the subset of smart meters (from the analysed meters) showing a relevant energy consumption pattern (e.g. consumption drop), and then determining the subset of those smart meters that also show a suspicious event pattern in the corresponding event data.

FIG. 2E illustrates an alternative approach. Here, the event stream from each smart meter is initially analysed to identify events/event patterns that may indicate tampering. Again, the event data 210 that is analysed may be a particular selected subset of event data, e.g. for a particular set of smart meters and/or event types (selected as described above), taken from the totality of collected data 200. If such events/event patterns are found for one or more smart meters, then the system retrieves the consumption data for those meters (e.g. in each case for a time window including the suspicious event/event pattern) and analyses it to detect any suspicious consumption patterns. If such a consumption pattern is found for a given meter then the meter is flagged as suspicious. Thus, in this approach, the set of suspected energy theft cases is given by first determining the subset of smart meters (from the analysed meters) showing a relevant event pattern, and then determining the subset of those smart meters that also show a suspicious consumption pattern in the corresponding consumption data (e.g. a consumption drop).

Thus, in the above approaches, the whole meter population (200) is initially analysed (e.g. by segmentation), a subset is then identified from this analysis for further analysis (e.g. based on consumption data, FIG. 2D, or event data, FIG. 2E) and this additional analysis identifies anomalies which could be investigated directly, or alternatively flagged for further analysis (e.g. based on event data, FIG. 2D, or consumption data, FIG. 2E).

The FIGS. 2D and 2E approaches are generally more computationally efficient since it is unnecessary to continuously analyse all the consumption and event data. In the FIG. 2D approach, only consumption data is initially analysed, with event data only analysed if a relevant consumption pattern is found. In the FIG. 2E approach, only the event data is initially analysed, with consumption data being analysed only if a suspicious event pattern is detected. The described techniques can thus serve to reduce a very large sample size of meter data (e.g. half-hourly meter readings collected over many weeks or months, from millions of smart meters) to a manageable volume to enable effective energy theft detection.

In practical applications, the FIG. 2E approach is often preferred since there is generally much more consumption data than event data for any given meter (e.g. consumption data for each meter may be recorded half-hourly or more frequently whereas events are only recorded as they occur). Nevertheless, these approaches may be suited to detecting different types of tampering/theft activity, and may thus also be used in combination.

The FIGS. 2D and 2E approaches are described in more detail in the following sections.

Consumption-Based Detection

Figure 3:
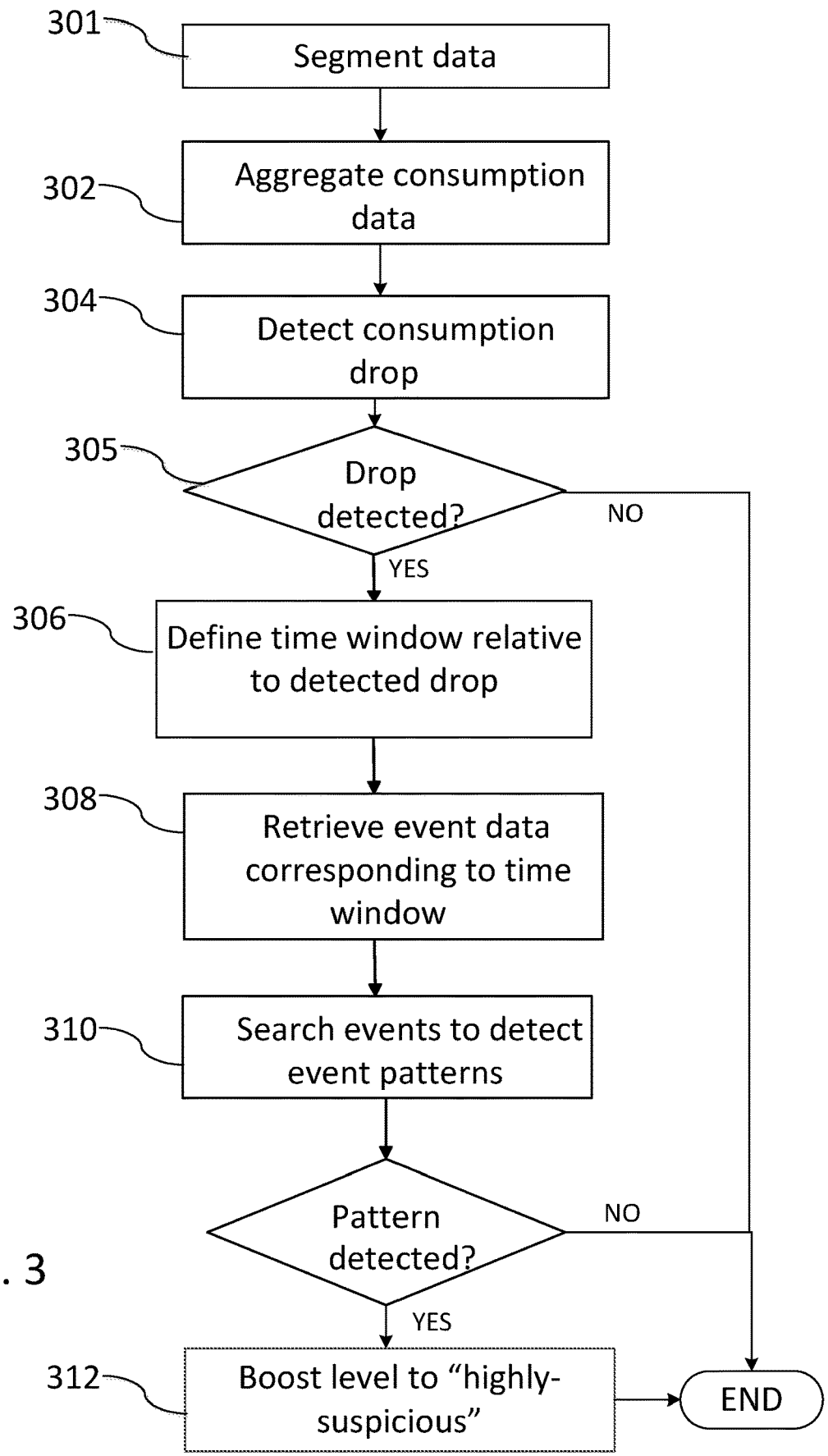
FIG. 3 illustrates a method for detecting tampering and energy theft by analysing consumption data.

An example of a process implementing the FIG. 2D approach is shown in FIG. 3.

The first stage of the process is to detect a sustained consumption drop.

To begin with, a data segment to be analysed is selected in step 301. Collected smart meter data may be segmented by, e.g., grouping meters by demographic, postcode or other geographical indicator, by customer or property attribute(s) or in any other appropriate way. Selection of the data segment to be analysed may be by operator input. Alternatively, step 301 may be skipped, if smart meter data for all monitored smart meters is to be analysed.

In step 302, half-hourly energy consumption data for the selected subset of smart meters is aggregated to daily granularity by summation (while half-hourly energy data is used in this example, the source data may have any time resolution depending on the underlying metering technology; e.g. in the near future smart meters may support metering down to the millisecond timeframe). Other pre-processing may be performed additionally or instead of aggregation, and/or the aggregation/pre-processing step may be omitted.

In step 304, the aggregated consumption data is analysed to identify a consumption drop. A consumption drop is defined as a significant decrease in the aggregated daily energy consumption value, i.e. where the magnitude of the decrease (expressed in absolute or relative terms) exceeds a threshold, followed by a sustained period of consistently low consumption (e.g. below a consumption threshold for a predetermined duration). A smart meter device can have many instances of consumption drops over time. The method checks whether the meter device has at least one consumption drop in a given time period; if so, the algorithm marks the meter as suspicious.

Note that instead of a daily aggregation, aggregation could be performed over any appropriate time period as required (or omitted).

The detection of the sustained consumption drop may be considered as indicating an initial (albeit possibly low) suspicion level and the smart meter may thus be flagged as suspicious at this point.

The second stage, after detecting a sustained consumption drop, involves identifying a relevant event pattern in the event data for the meter (e.g. matching a predefined event sequence).

In particular, in step 306, a temporal window is defined at the time of the consumption drop detected previously. The time window preferably extends a given period before and after the time of the consumption drop (e.g. a window of predetermined duration centred on the consumption drop may be used). In step 308, event data for the smart meter is retrieved corresponding to the time window (i.e. any events occurring in the time window).

At step 310 the events are then searched for a particular event sequence or pattern within the given temporal window at the time of the consumption drop. If such an event sequence or pattern is found, the suspicion level of the corresponding meter device is boosted to highly-suspicious at step 312. On the other hand, if no relevant event pattern is found then the meter may be marked as not suspicious and the process ends.

Note that the pattern may be the occurrence of a given set of events (e.g. event 1 and event 2) in the time window in any order or may be a specified sequence (e.g. event 1 followed by event 2). Also, a single event of a given type may on its own constitute a pattern (in other words, detection of a particular critical event type within the time window may be sufficient to flag the meter as highly suspicious in step 312).

A variety of different critical events, event patterns and sequences may be defined which the system attempts to match. In some embodiments different events/patterns/sequences may be associated with different risk levels, e.g. one of plurality of risk/suspicion levels. In other embodiments the level may be binary, e.g. defined as either suspicious or non-suspicious.

An event pattern or sequence may be associated with additional constraints that need to be met in order for observed events to be considered to match the pattern/sequence. For example, in addition to observing an event of a predetermined event type (e.g. having a particular event code), other attributes of the event (e.g. data sent as part of a meter alert) may have to match criteria defined for the event pattern. As a further example, the pattern may have timing constraints defined—for example, a pattern may specify the occurrence of two defined events (optionally in a defined order) within a threshold time distance from each other.

The system may store data about monitored smart meters in a database, which may be updated by the FIG. 3 process (e.g. at step 306/312) to indicate suspicion level, e.g. by setting a flag or other indicator that indicates that tampering or energy theft is suspected (possibly specifying a suspicion level).

Event-Based Detection

Figure 4:
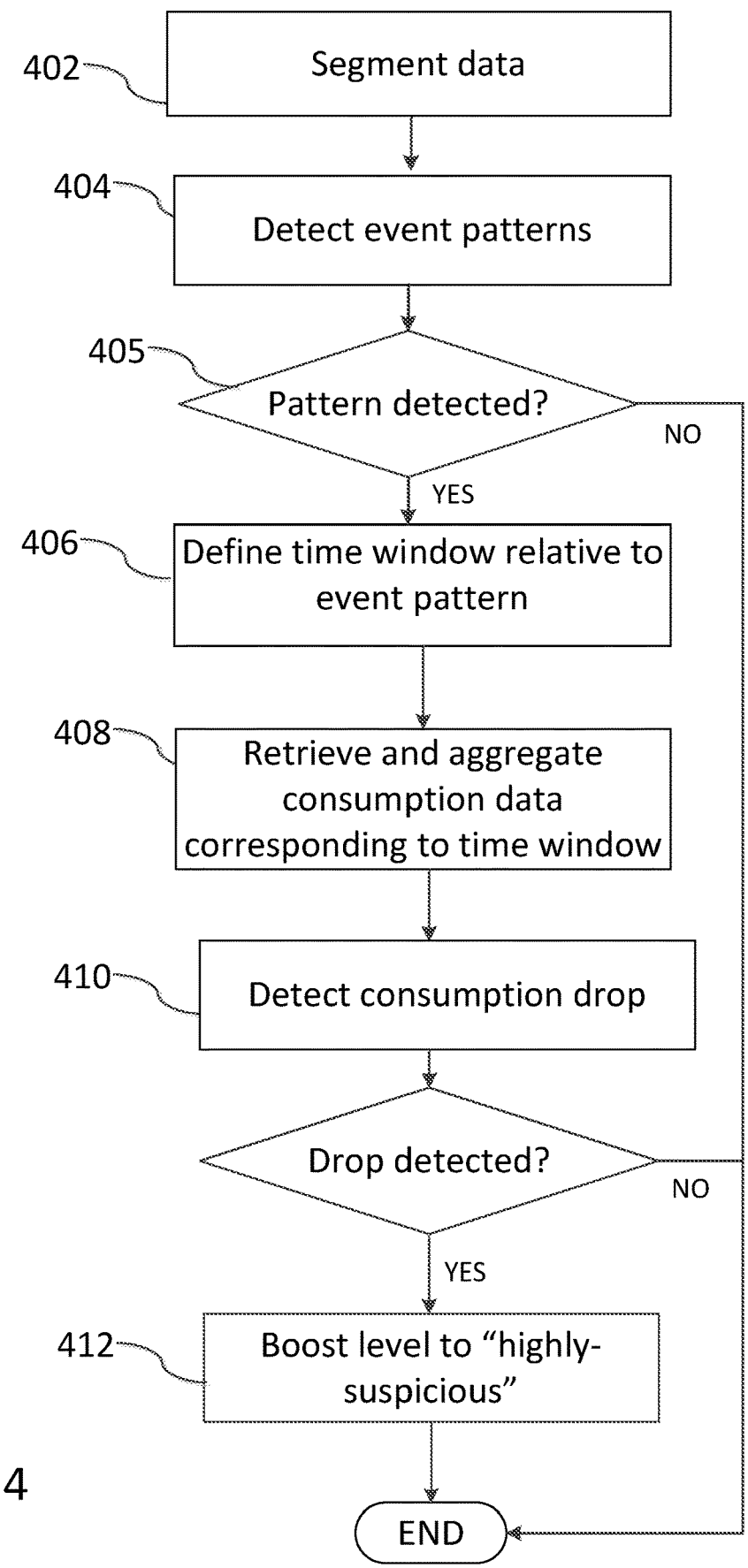
FIG. 4 illustrates a method for detecting tampering and energy theft by analysing event data.

An example of a process implementing the FIG. 2E approach is shown in FIG. 4.

In this approach, the first stage of the process involves detecting an event pattern (event patterns are defined as described previously, and the term "pattern" thus includes singular critical events as well as more complex patterns and sequences).

Thus, in step 402, a set of event data is selected. Data may be segmented as described above with regard to step 301 in FIG. 3, e.g. based on geographical criteria etc. with an operator selecting the data segment to be analysed (alternatively the complete set of available data may be analysed).

In step 404, the event data for the selected group of meters is analysed to identify a pattern of events, such as by matching the event history against a predefined critical event or event sequence. Where a pattern includes multiple events the process may search for these using a sliding time window. If at least one critical event/event pattern is detected in the event data for a meter, then the algorithm marks the meter as suspicious (e.g. by updating a meter database as indicated above).

The second stage, after matching a predefined event pattern, then involves detecting a sustained consumption drop.

In particular, in step 406, a temporal window is defined at the time of the event pattern. The time window preferably extends a given period before and after the time of the detected event pattern (e.g. a window of predetermined duration centred on the event pattern may be used). In step 408, consumption data for the smart meter is retrieved corresponding to the time window (e.g. consumption during predetermined periods before and after the event sequence/pattern).

As before, the process uses aggregated consumption data, which may be generated ahead of the analysis (e.g. during data collection), or alternatively the aggregation may be performed dynamically on retrieval in step 408 (as previously described, in this example, half-hourly energy consumption data is aggregated to daily granularity but other aggregation resolutions may be used).

At step 410 the consumption data is analysed to detect a consumption drop during the given temporal window at the time of the event pattern. As in the FIG. 3 approach, a consumption drop is defined as a significant decrease in the aggregated daily energy consumption value which exceeds a threshold, followed by a sustained period of consistently low consumption.

In one embodiment, rather than merely searching for a consumption drop anywhere in the relevant time window, consumption before and after the detected event pattern is compared directly. If the consumption values after the event pattern are lower than the ones before by a certain threshold (again this may be in relative or absolute terms) and sustained at a consistent level (e.g. remaining below a threshold) for a given time, the meter may be considered suspicious.

In another embodiment, once the event pattern is detected, the algorithm compares the set of consumption values before and after the matched event pattern using a statistical test to determine if there is a consumption drop and whether any such drop is statistically significant. A wide range of tests can be used to examine statistical significance, such as unpaired two-sample Student's T-test and Mann-Whitney's U test. If the consumption drop is statistically significant according to the applied test, then the meter can be considered suspicious.

Once a relevant consumption drop has been found, the suspicion level of the corresponding meter device is boosted to highly-suspicious at step 412 (e.g. by updating the entry in the meter database). On the other hand, if no consumption drop is found then the meter may be marked as not suspicious and the process ends.

One concrete example of an event pattern that may be detected is a pair of events that signifies power off/on of the meter within a given time duration. When the elapsed time between this pair of events is longer than a normal meter re-adjustment time (typically less than a few minutes), then the consumption pattern surrounding the pair of events is analysed (steps 406-410), and the meter is identified as suspicious when the drop is significant (step 412).

Further Approaches to Event and Consumption Data Processing

The following sections describe further approaches to analysing the event and consumption data, which may be used in any of the FIGS. 2A-2E, 3 and 4 processes (or may in some cases be used independently).

As indicated above, one way to try to detect energy theft could be to couple drops in the consumption data with critical events, e.g. critical alerts sent by a meter. However, in some cases the critical alerts are not well defined and this method could retain too many false positives.

A preferred approach is thus to use patterns of a plurality of events to detect complex events. Additionally, anomaly detection may be used to detect outlying patterns in the data. There are several ways to perform anomaly detection across a range of statistical techniques. In order to perform anomaly detection on event data an unsupervised learning approach, such as clustering, may be used if there is no large training set available. Anomaly detection can require knowledge of the normal state of behaviour. Complex event detection in general relies on knowing what an event is;

its power is in combining events in different data sets to get a complex event. To know what patterns are indicative of normal behaviour sequence mining can be used to detect patterns in groups of event data.

In one embodiment, the system looks for frequent groups of events that follow each other in a given time window and generates a set of rules from this. The sequences may be found using a rule growth algorithm. The timing between events can then be determined. The usefulness of an event may be determined by its performance across several metrics. Once the event or rule is discovered it can then be fed into a complex event processing engine to perform detection. This approach can develop rules such as if {a,b} happen then in t time {c} will happen. This is the type of event sequence that might be found in alert data from smart meters and therefore this procedure could be applied to detect anomalies. One advantage of this method is that it is time resolved, which can be useful in separating data indicative of energy theft from a system malfunction or engineer visits.

Thus, in the approaches illustrated in FIGS. 2A-2E, 3 and 4, the detection of event patterns (e.g. FIG. 3 step 310 and FIG. 4 step 404) may also detect anomalous patterns. In contrast to detecting particular predefined patterns of events that are considered suspicious, as described previously, this approach identifies patterns that diverge from expected patterns (e.g. as specified by rules learned automatically as described above). Embodiments may use detection of anomalous patterns instead of, or in addition to, detection of known patterns.

Event patterns may be established through clustering. For example, a time frame can be defined around a critical event and then events occurring in those time windows can be clustered to identify patterns. Suitable clustering techniques include PCA (Principal Component Analysis), k-means clustering, and the like.

In some cases, detection of critical events/alerts or patterns of events/alerts may alone be sufficient to create a suspicion that tampering or energy theft have occurred. In that case, a meter could be flagged as suspicious immediately without analysing the consumption data (e.g. moving directly from step 405 to step 412 in FIG. 4). As a further variation, for certain events/patterns (which are associated with a high suspicion of tampering) a lower consumption drop threshold could apply than for other events/patterns.

Various approaches may be used to detect consumption drops in the consumption data. In one example, a consumption drop is defined in relative terms, as consumption in one period (e.g. time T1 to T2) being less than or equal to a specified proportion—e.g. one half—of the consumption in the preceding period (e.g. T0 to T1).

The system may also identify a consumption drop by comparing specific consumption for periods which are not necessarily temporally adjacent. In one example, consumption is aggregated for particular months of the year, with consumption for a given month in one year being compared to consumption for the same month the following year (e.g. July of one year to July of the next year).

Identifying a drop in consumption can also be achieved by looking at the differential in energy over a rolling time frame. General trends in energy consumption over the time frame may be found in order to detect anomalous behaviour. This can include seasonal or weekly trends, or trends over another predetermined timescale.

While in the above examples, consumption drops are determined in relation to the earlier consumption recorded for a given smart meter, in an alternative approach, low consumption may also be identified in relation to other smart meters. In one embodiment, the system looks at consumption trends based on meters at geographically proximate locations; in such cases the meters may not be treated as individual objects. For example, a normal behaviour for a geographical area may be determined and a smart meter in that geographical area may be flagged if it is deviating highly from the behaviour of the surrounding area (e.g. if consumption for a defined period is below average consumption for the group of meters in the geographical area by more than a threshold). In this approach weather incidents may not give a high reading for anomalous behaviour. However, if the site was large or perhaps generated energy that it fed back to the grid it may be more likely to trigger anomalous behaviour. One challenge to this approach is to ensure the correct geographical segmentation is achieved.

Instead of a geographical segmentation, the system may segment meters in some other way to provide representative average consumption values. For example, a population of meters may be segmented based on one or more customer attributes (e.g. property type, occupancy of property). An average consumption value (e.g. for a particular period such as a given month) is determined for each segment from meter data for meters in the segment. Consumption data for the meter being analysed is then compared to the average consumption for the segment to which the meter belongs (based on the corresponding customer attribute(s) applicable to that meter). Again, if the consumption is less than the average by more than a threshold amount/proportion this is identified as a consumption drop.

Determination of a consumption drop based on comparison to consumption of other meters (whether based on geographical or attribute segmentation or in any other way) may take place instead of the determination carried out in FIGS. 3/4 (where consumption data for the same meter but for different time periods is compared). Alternatively, evidence from different sources may be combined. In one example, the system analyses the data in different ways, searching for consumption drops both within the specific meter's consumption data and in comparison to other meters (e.g. segmented in one or more different ways as set out above). Any identified consumption drop may than be used as evidence that a meter should be identified as potentially suspicious (FIG. 3 step 305) or highly suspicious (FIG. 4 step 412).

In a further example, customer consumption is segmented by week to create a weekly baseline consumption value. A week-day baseline consumption and a weekend-day baseline consumption may be established separately. A sample of another week is then taken and compared to the baseline, and if the consumption of the period is different, by a chosen threshold, from the baseline then this may be considered anomalous. Time-based and customer-based segmentation may be combined; e.g. the comparison baseline can be determined based on meters of customers within a given segment (geographical or attribute-based etc.) in a certain time frame.

Another way to look for anomalous drops in consumption is to use ARIMA (autoregressive integrated moving average) forecasting to predict future energy demand and then analyse deviations from this trend. ARIMA forecasting can take into account long and short range trends and attempt to predict where the next consumption point will be. If the recorded consumption differs significantly from the expected consumption, then it may be possible to detect an anomalous event. ARIMA forecasting maps the next point by taking information over the available time span so may be sensitive to seasonal changes.

In addition to looking for drops in consumption at a meter (compared to prior consumption measured by the meter, or compared to consumption by other meters) other kinds of consumption anomalies may be detected and may be used instead of or in addition to the consumption drops detected in FIGS. 3/4. For example, consumption increases or spikes could be detected.

In the above examples, analysis is performed based on previously collected data. However, the methods can also be applied in real-time (or near real-time). For example, in the FIG. 3 process, incoming consumption data may be continuously monitored (possibly for a selected segment of the meter population or specific identified meter(s)) until a consumption drop is detected (step 304), with the analysis then proceeding as per FIG. 3. Similarly, in the FIG. 4 process incoming event data may be continuously monitored (possibly for a selected segment of the meter population or specific identified meter(s)) until a relevant event or event pattern is detected (step 404), with the analysis then proceeding as per FIG. 4.

Complex Event Processing

Figure 5:
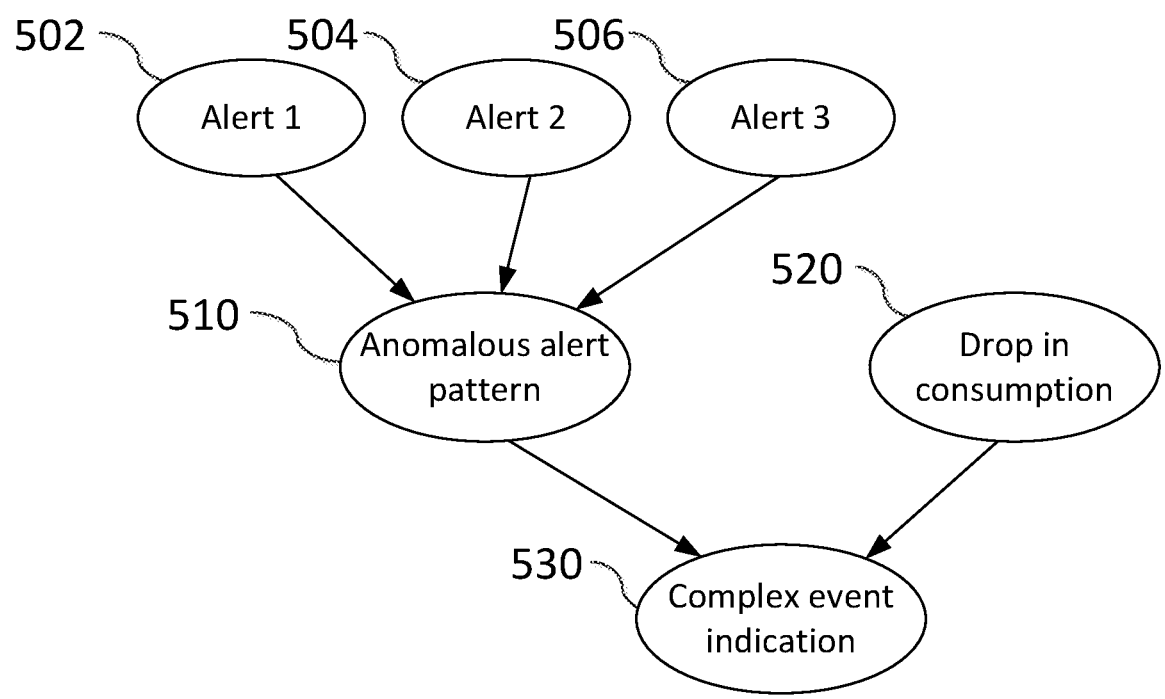
FIG. 5 illustrates a method for identifying event patterns.

Embodiments may include a complex event processing engine implementing complex event processing techniques to analyse different events from different data streams at different times and correlate them through filtering and aggregation into a higher level event. For example, in the detection of energy theft the base events may be an anomalous pattern of events (e.g. meter alerts) surrounded with a drop in consumption data, as shown in FIG. 5. In FIG. 5 a plurality of individual meter alert events 502, 504, 506 contribute to an anomalous alert pattern 510, which can be detected (although each of the events 502, 504, 506 on their own may not be sufficient to identify an anomalous pattern). When the anomalous alert pattern 510 occurs in conjunction (e.g. at the same or similar time, within a time range) with a drop in consumption 520, then a complex event 530 representing suspected energy theft can be identified. Complex event processing may, for example, be operated with time rules which enforce that an energy theft event is not be detected unless a consumption drop happens around the alert sequence time.

Computer System

Figure 6:
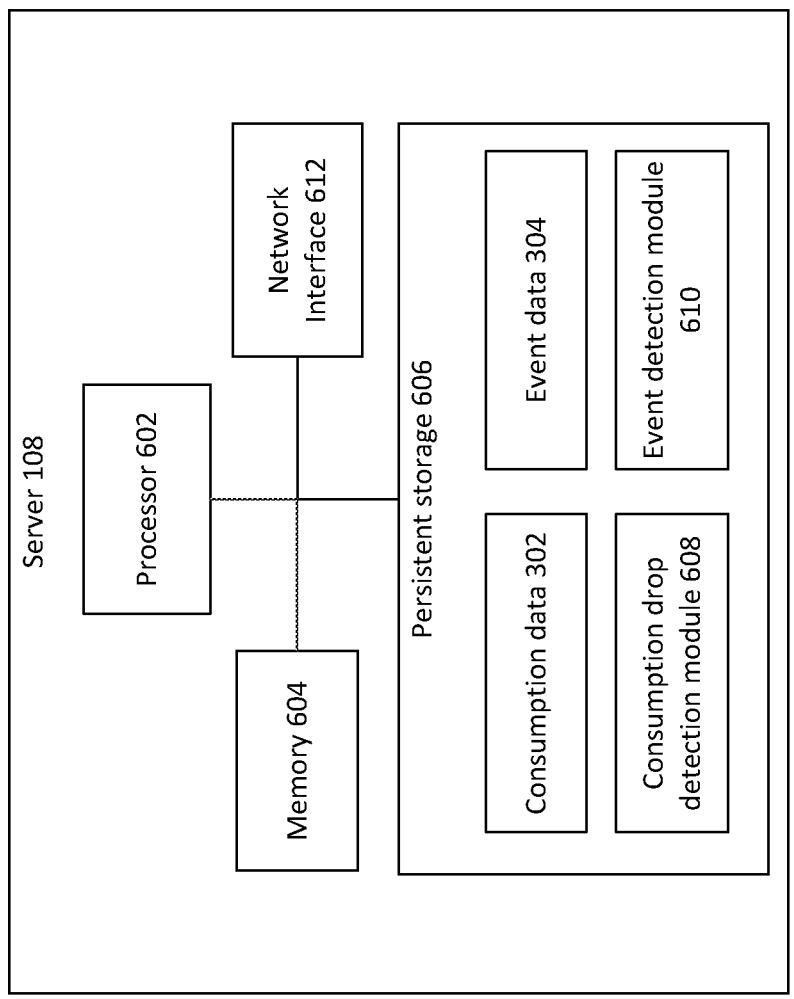
FIG. 6 illustrates a computer device suitable for performing described methods.

FIG. 6 illustrates a computer system which may be used for implementing the methods described above.

The computer system is in the form of analysis server 108. The server includes one or more processors 602 together with volatile/random access memory 604 for storing temporary data and software code being executed. Persistent storage 606 (e.g. in the form of hard disk or solid state storage) persistently stores software and data, including a consumption drop detection module 608 and an event detection module 610 and the various data used by the analysis server, e.g. consumption data 302, and event data 304. The persistent storage may include other software and data, such as an operating system and device driver software for general operation of the server.

A network interface 612 allows communication with external networks (including the Internet). The server can connect to the data collection system and/or smart meters using the network interface to receive data such as consumption data and event data. The server can also communicate via the network interface and connected networks with a user device to provide access to the energy theft or consumption data and analysis results, e.g. via a web interface or client application.

In one embodiment, such a web interface or client application provides facilities for displaying event data and consumption data for particular meters and for outputting the result of the analysis. In particular, meters for which suspicious consumption and/or event patterns were detected can be listed with suspicion levels indicated, allowing an operator to investigate the situation further or take relevant actions, such as scheduling an inspection visit or disabling energy supply to the relevant property.

Figure 7:
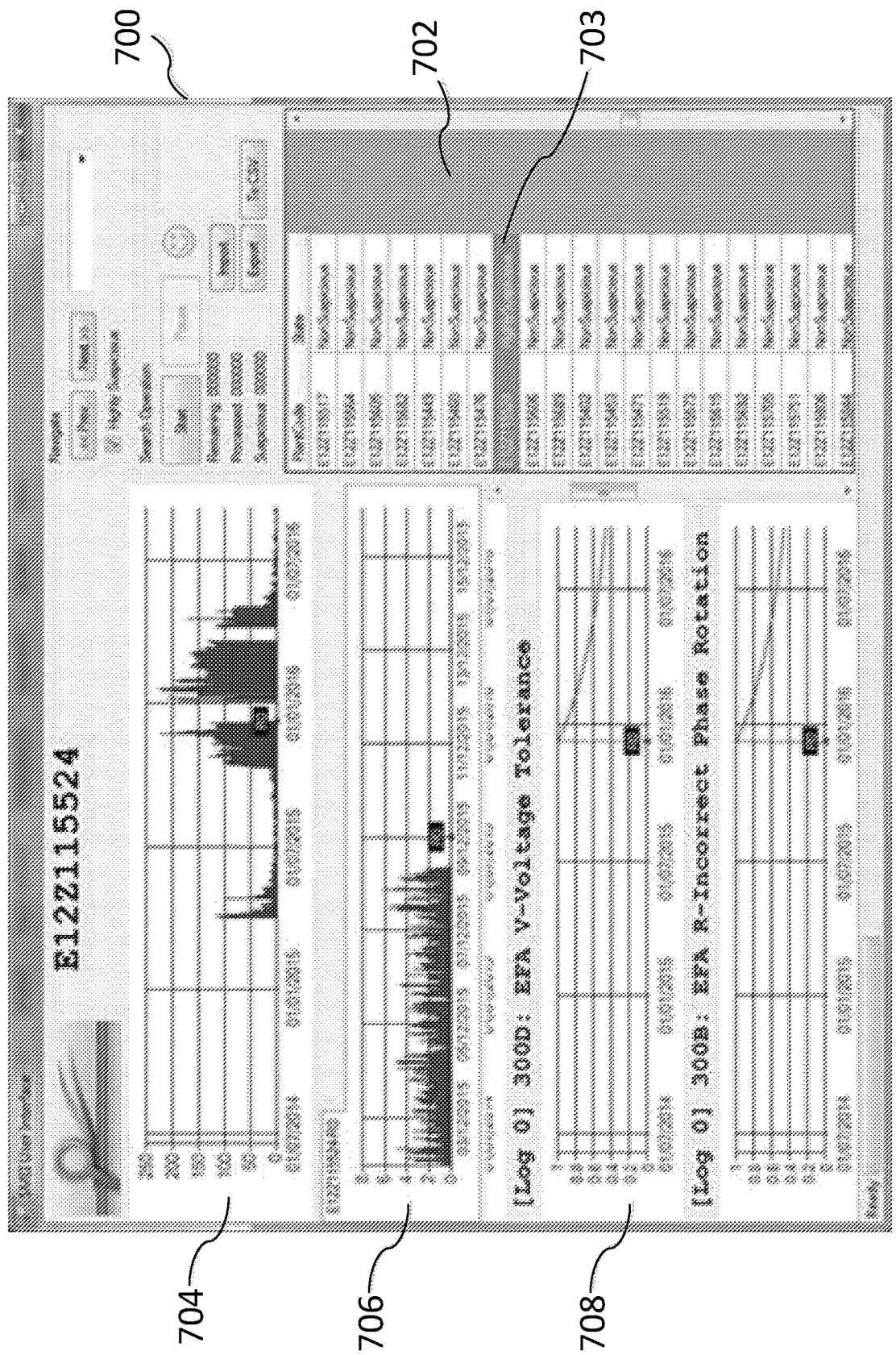
FIG. 7 depicts a user interface of a client application for interacting with the system.

An example of a client application interface is depicted in FIG. 7. Here, client application 700 includes a list 702 of meters for which analysis has been performed, showing a meter identifier and a suspicion level (here a binary classification as "Non Suspicious"/"Highly Suspicious" is shown). A particular highlighted entry 703 has been selected and additional information is displayed for the selected meter in other parts of the interface. The displayed information includes a consumption graph 704 plotting consumption over time for the meter, showing a drop in consumption near a point in time marked RO. Graph 706 shows consumption data at a greater temporal resolution. Area 708 displays information on detected meter alerts relevant to identifying the meter as suspicious.

The analysis server may also implement automatic actions in response to detecting suspected energy theft. For example, where the FIG. 3 or 4 processes identify a high suspicion level (steps 312/412), energy supply to the property where the meter is installed may be disabled automatically, and/or a physical examination of the meter may be scheduled automatically.

In some embodiments a notification could be sent to an operator or user (e.g. by SMS/email or as a notification within an application on their device), alerting them to the detected problem with the meter. Such a notification may also include an option to select one or more actions that the user/operator may select, such as disabling energy supply to the property, scheduling an inspection visit or re-enabling energy supply if the system has automatically disabled the supply.

Note that the functions of analysis server 108 and data collection system 102 may be combined in a single server (e.g. the server depicted in FIG. 6) or may be divided across multiple computing nodes in any appropriate fashion.

While described above principally in relation to detection deliberate tampering and energy theft, the methods may also be applied to detecting faults of the meter or of the energy consuming devices/appliances connected to the meter and located at the location served by the meter. Thus, the detected energy consumption condition need not necessarily be a consumption drop but could also be a consumption increase (which could represent a fault in the meter or in a connected appliance), or some other predetermined consumption pattern or condition.

Furthermore, the invention has been described above mainly in relation to energy metering, but can also be applied to metering of other consumable substances/quantities. One example is water metering, and thus the invention could also be applied to smart water meters.

The above embodiments and examples are to be understood as illustrative examples. Further embodiments, aspects or examples are envisaged. It is to be understood that any feature described in relation to any one embodiment, aspect or example may be used alone, or in combination with other features described, and may also be used in combination with one or more features of any other of the embodiments, aspects or examples, or any combination of any other of the embodiments, aspects or examples. Furthermore, equivalents and modifications not described above may also be employed without departing from the scope of the invention, which is defined in the accompanying claims.

The invention claimed is:

1. A method of detecting conditions indicative of utility meter tampering, meter faults or theft of a utility, comprising:
receiving, from a meter:
consumption data indicating consumption of a utility at a location served by the meter; and event data comprising one or more events generated by the meter, wherein events comprise status messages generated by the meter indicating a status or status change of the meter;

analysing the consumption data to detect a predetermined consumption condition;

analysing the event data to detect a predetermined event or event pattern in the event data; and generating an alert condition in response to detecting both the consumption condition based on the consumption data and the event or event pattern based on the status messages.

2. The method according to claim 1, comprising generating an alert condition in response to at least one of: detecting a temporal correlation between the consumption condition and the event or event pattern; and detecting that the consumption condition occurs in the consumption data within a predetermined temporal distance from the occurrence of the event or event pattern in the event data.

3. The method according to claim 1, comprising:
performing the step of analysing the event data in response to detecting the consumption condition.

4. The method according to claim 3, wherein the consumption data comprises a time series of consumption values associated with time information, and wherein detecting the consumption condition comprises determining a time at which the consumption condition occurs in the consumption data;

wherein each event in the event data is associated with time information indicating a time of the event, the method comprising selecting one of:

a set of event data temporally adjacent to the detected consumption condition;

a set of event data in a time window including the time of the consumption condition, the time window having a predetermined duration and/or including one or both of: a time period immediately preceding the time of the consumption condition and a time period immediately subsequent to the time of the consumption condition; and wherein the step of analysing event data comprises analysing the selected set of event data.

5. The method according to claim 1, comprising:
performing the step of analysing the consumption data in response to detecting the event or event pattern.

6. The method according to claim 5, wherein the consumption data comprises a time series of consumption values associated with time information, and wherein each event in the event data is associated with time information indicating a time of the event, the method comprising at least one of:

selecting a set of consumption data temporally adjacent to the detected event or event pattern; and selecting a set of consumption data corresponding to a given time window, the time window selected in dependence on a time of the detected event or event pattern, wherein the time window includes the time of the event or event pattern and one or both of: a time period immediately preceding the event or event pattern and a time period immediately subsequent to the event or event pattern;

wherein the step of analysing consumption data comprises analysing the selected set of consumption data.

7. The method according to claim 1, wherein the consumption condition comprises one of:

a decrease in consumption, wherein detecting the consumption condition comprises detecting the decrease in consumption, the decrease having an absolute or relative magnitude exceeding a threshold magnitude; and a decrease in consumption followed by a sustained period of low consumption, wherein detecting the consumption condition comprises detecting, subsequent to the decrease in consumption, a period of a predetermined duration during which the consumption remains below a threshold consumption amount.

8. The method according to claim 7, wherein analysing the consumption data comprises comparing consumption data temporally preceding the detected event or event pattern to consumption data temporally succeeding the detected event or event pattern to detect the decrease in consumption.

9. The method according to claim 7, comprising computing an indicator indicating whether the decrease is statistically significant, and detecting the consumption condition in dependence on the indicator.

10. The method according to claim 1, wherein the consumption condition comprises a divergence in consumption from a predetermined typical consumption value, the method further comprising determining the typical consumption value based on consumption data for a set of meters of which the meter is a member, wherein the set of meters is selected based on geographical proximity of the installation locations of the meters in the set.

11. The method according to claim 1, wherein the event pattern comprises at least one of:

a predetermined sequence of events, the method comprising detecting the event pattern in response to identifying an ordered set of events in the received event data matching the predetermined event sequence; and a first and second event occurring within a specified time duration of each other.

12. The method according to claim 1, wherein detecting an event pattern comprises detecting an anomalous event pattern that differs from an expected event pattern, the method comprising analysing event data from a plurality of meters to determine one or more expected event patterns using at least one of: a machine learning process, and event clustering.

13. The method according to claim 1, wherein the meter is an energy meter for measuring energy consumption and wherein the consumption data comprises energy consumption data.

14. The method according to claim 1, wherein the meter is one or more of: an electricity meter, a gas meter, a water meter; and a network-connected smart meter, wherein the consumption data and/or event data are received via one or more networks.

15. The method according to claim 1, wherein generating the alert condition comprises one or more of:

setting a meter attribute associated with the meter in a database to indicate a suspected condition indicative of meter tampering, meter fault or theft of a utility;

outputting an alert indication to a user interface;

sending an alert notification to a user device associated with an operator or other user; and scheduling a physical examination of the meter.

16. The method according to claim 1, comprising analysing data from a plurality of utility meters to determine whether a physical examination of a utility meter is required, the method comprising:

receiving meter readings and meter events from the plurality of utility meters;

compiling a data set from the meter readings and meter events;

segmenting the data set into subsets according to one or more predetermined parameters;

analysing data in a subset using statistical methods to determine whether meter readings or meter events from each meter are abnormal;

identifying a meter that generated abnormal data; and sending a notification to an operator including an indication of the meter identified as abnormal.

17. The method according to claim 16, wherein the one or more predetermined parameters include any one of, or any combination of: geographical area of a location where a meter is installed (e.g. postal code), demographic group of a utility customer associated with a meter, meter type, utility type, and customer type (e.g. home or industrial).

18. A non-transitory computer-readable medium comprising software code adapted, when executed on a data processing apparatus, to perform operations for detecting conditions indicative of utility meter tampering, meter faults or theft of a utility, the operations comprising:

receiving, from a meter:

consumption data indicating consumption of a utility at a location served by the meter; and event data comprising one or more events generated by the meter, wherein events comprise status messages generated by the meter indicating a status or status change of the meter;

analysing the consumption data to detect a predetermined consumption condition;

analysing the event data to detect a predetermined event or event pattern in the event data; and generating an alert condition in response to detecting both the consumption condition based on the consumption data and the event or event pattern based on the status messages.

19. A system comprising at least one processor and associated memory storing instructions configured, when executed by the at least on processor, for detecting conditions indicative of utility meter tampering, meter faults or theft of a utility, the system configured to:

receive, from a meter:

consumption data indicating consumption of a utility at a location served by the meter; and event data comprising one or more events generated by the meter, wherein events comprise status messages generated by the meter indicating a status or status change of the meter;

analyse the consumption data to detect a predetermined consumption condition;

analyse the event data to detect a predetermined event or event pattern in the event data; and generate an alert condition in response to detecting both the consumption condition based on the consumption data and the event or event pattern based on the status messages.

* * * * *